(12) United States Patent
Bender et al.

(10) Patent No.: US 8,257,496 B1
(45) Date of Patent: Sep. 4, 2012

(54) CRUCIBLE WEIGHT MEASUREMENT SYSTEM FOR CONTROLLING FEEDSTOCK INTRODUCTION IN CZOCHRALSKI CRYSTAL GROWTH

(75) Inventors: David L. Bender, Thousand Oaks, CA (US); Gary Janik, Palo Alto, CA (US); Roy P. Crawford, Saratoga, CA (US); David E. A. Smith, San Mateo, CA (US)

(73) Assignee: Solaicx, Inc., Santa Clara, CA (US)

( * ) Notice: Subject to any disclaimer, the term of this patent is extended or adjusted under 35 U.S.C. 154(b) by 721 days.

(21) Appl. No.: 12/315,452

(22) Filed: Dec. 3, 2008

Related U.S. Application Data

(60) Provisional application No. 61/005,426, filed on Dec. 4, 2007.

(51) Int. Cl.
*C30B 35/00* (2006.01)

(52) U.S. Cl. ........ 117/206; 117/200; 117/201; 117/202; 117/214; 117/13; 117/14; 117/15; 117/30; 117/33

(58) Field of Classification Search ............. 117/200, 117/201, 202, 206, 214, 13, 14, 15, 30, 33
See application file for complete search history.

(56) References Cited

U.S. PATENT DOCUMENTS

2005/0092236 A1* 5/2005 Bender .................. 117/200
* cited by examiner

*Primary Examiner* — Matthew Song
(74) *Attorney, Agent, or Firm* — Armstrong Teasdale LLP

(57) ABSTRACT

A weighing system is provided for a continuous Czochralski process that accurately measures the weight of the crucible and melt during crystal growth to control the introduction of feedstock in order to keep the weight approximately constant. The system can measure the weight of the crucible while the crucible is rotating, and is insensitive to vibrations of the melt surface as well as variable torques on the crucible shaft induced by the rotation. The system also measures the weight of the crucible and its contents in order to control the amount of feedstock recharged after an ingot is withdrawn.

4 Claims, 5 Drawing Sheets

CRUCIBLE WEIGHT MEASUREMENT SYSTEM FOR CONTROLLING FEEDSTOCK INTRODUCTION IN CZOCHRALSKI CRYSTAL GROWTH

CROSS REFERENCE TO RELATED APPLICATION

This patent application claims the benefit of U.S. provisional application Ser. No. 61/005,426, filed Dec. 4, 2007.

BACKGROUND

1. Field of the Invention

The field of the invention generally relates to growing single crystal silicon by the Czochralski (CZ) technique. In particular, the field of the invention relates to a system and method for measuring crucible weight in order to control the introduction of feedstock resulting in stable and repeatable crystal growing conditions for producing uniform crystals efficiently.

2. Background of Related Art

Conventional Czochralski crystal growth processes generally deplete the melt in the crucible as the crystal is grown. The height of the top of the melt, known as the melt level, therefore drops during growth. The melt height with respect to the heaters, heat shields, and gas flow diverters is an important growth parameter, and is best kept constant for optimum stable crystal growth. One method of compensating for the variable melt height is to raise the crucible as the crystal is grown. This method is mechanically complex and also does not completely keep the growth conditions constant, since the crucible and its support structure still move with respect to the heaters, heat shields, and gas flow diverters. Another method for compensating for the melt depletion is to add more raw feedstock into the melt to replace the withdrawn material. It is best to have some measurement of the melt level and/or melt mass in order to control the feedstock introduction. One method of melt level measurement that has been used is optical reflection from the melt surface. Optical reflection from the melt is difficult because the melt is surrounded by radiation shields and insulation which may be closely positioned to the growing ingot. It is necessary to compromise the shields and insulation in order to provide an optical path for the measurement. Also, vibration of the melt causes fluctuations of the melt surface which can upset the melt level measurement. This is particularly troublesome since both the melt and crystal are generally rotating during crystal growth, adding to the potential for vibration.

In another method of Czochralski crystal growth the melt is allowed to substantially deplete, the crystal is withdrawn from the chamber, and then the crucible is recharged with solid feedstock. In this case the optical reflection method cannot be used to control the introduction of feedstock since there is no melt surface initially.

In all CZ growth processes (batch, batch recharged, or continuous), it is important to know and control the mass of silicon in the melt at the beginning of the process. The amount of silicon at the beginning of the process sets the boundary conditions for the heat flow and gas flow characteristics of the process which are to be matched from run-to-run to optimize grower performance. Slight variations in hardware setups (stack up tolerances for instance) can influence a measured melt height leading to error in determining silicon mass if the melt height reference is shifted accidentally leading to variations in heat flow characteristics.

For all of these reasons, it would be advantageous to have a reliable method of measuring the total amount of melt and feedstock in the crucible.

SUMMARY

In order to overcome the foregoing limitations and disadvantages inherent in a conventional CZ process for growing single crystal silicon wafers, an aspect of the invention provides a system to measure the weight of the crucible and melt during crystal growth and control the introduction of feedstock in order to keep the weight approximately constant. It is also an aspect of this invention to measure the weight of the crucible and its contents in order to control the amount of feedstock recharged after a crystal is withdrawn. Another aspect of this invention is to provide a system that can measure the weight of the crucible while the crucible is rotating and that is insensitive to vibrations of the melt surface as well as variable torques on the crucible shaft induced by the rotation.

BRIEF DESCRIPTION OF THE DRAWINGS

The drawings are heuristic for clarity. The foregoing and other features, aspects and advantages of the invention will become better understood with regard to the following description, appended claims and accompanying drawings in which:

DETAILED DESCRIPTION

Figure 1:
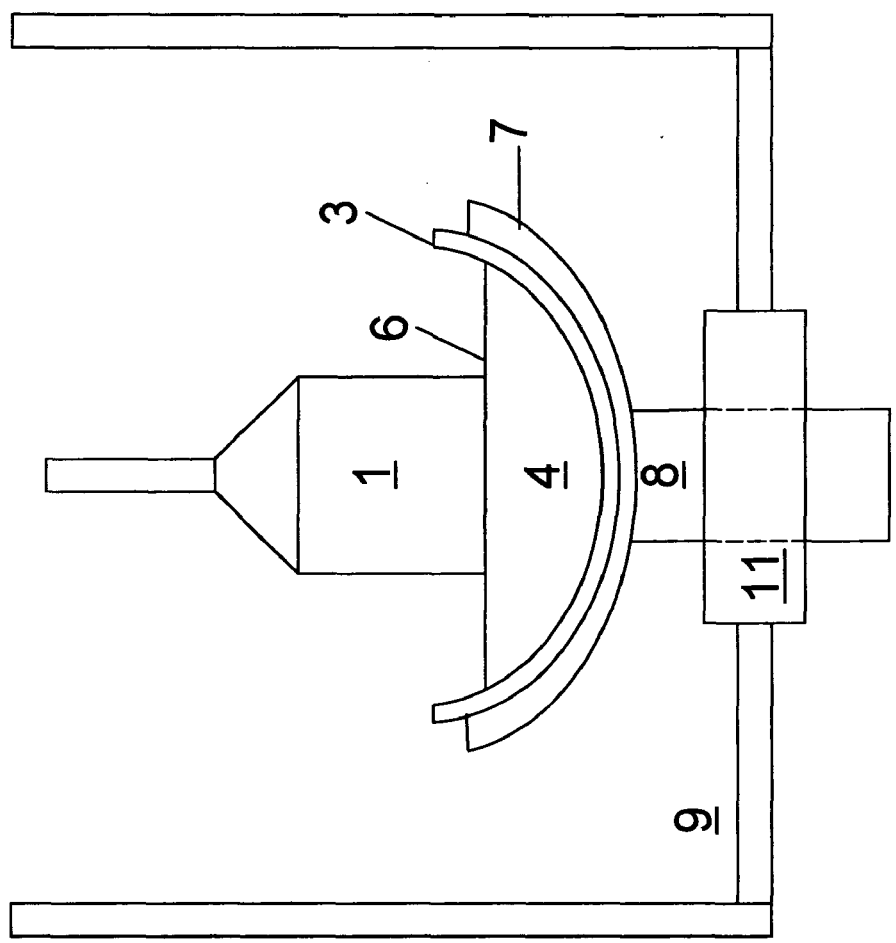
FIG. 1 is a schematic side view of a conventional CZ system.

FIG. 1 shows a side view of a conventional CZ growing system. The crystal ingot 1, is pulled out of the melt 4. The melt 4 is contained in the crucible 3 which is held by the crucible holder 7. The crucible and the crucible holder are supported on the crucible shaft 8. The crucible shaft is sealed to the vacuum chamber 9 by a vacuum bearing 11. The vacuum bearing 11 supports the crucible shaft, crucible holder, crucible, and the melt, while allowing them all to rotate together. The rotating shaft and/or motor for producing rotation may cause undesirable vibration of the melt. Such vibration in turn causes fluctuations of the melt surface which can upset the melt level measurement. This is particularly troublesome since both the melt and crystal are generally rotating during crystal growth, adding to the potential for vibration.

Figure 2:
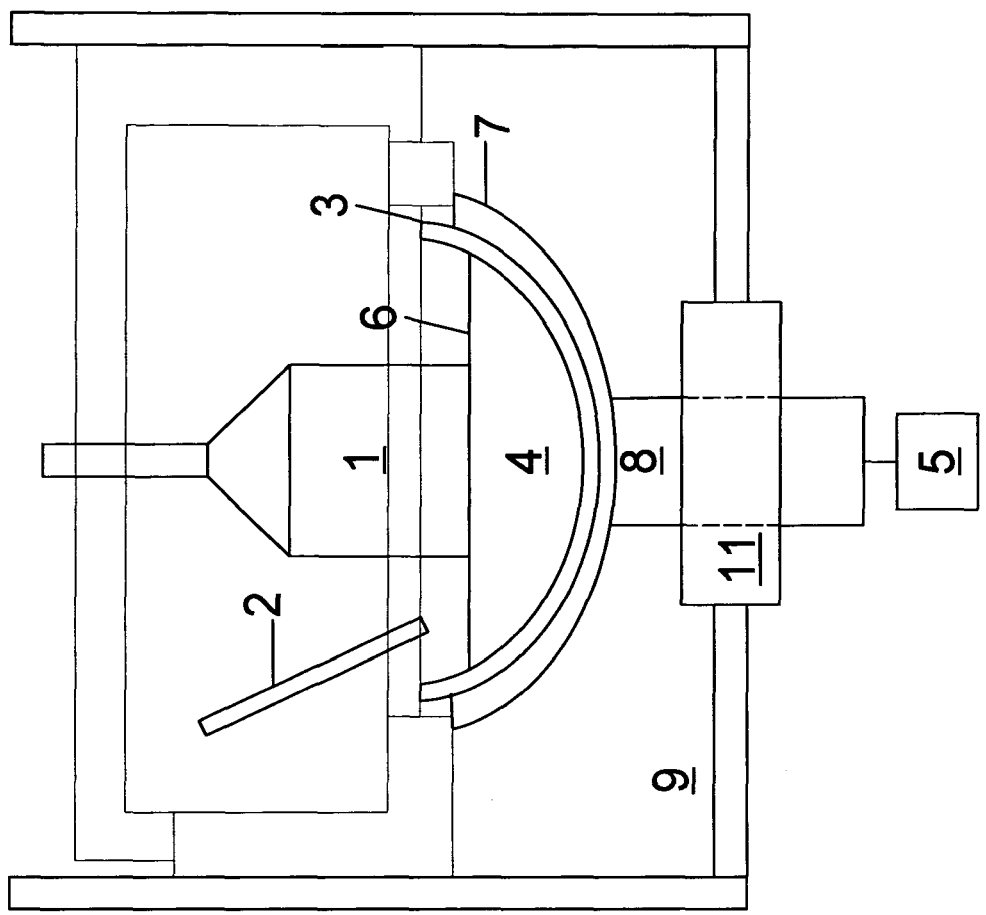
FIG. 2 is schematic side view of a CZ system with a subsystem for introducing feedstock and a crucible weighing system according to an aspect of the invention.

FIG. 2 shows a side view of a CZ growing system incorporating a feed tube 2 used to introduce feedstock to the melt. In addition, a crucible weighing system 5 is used to weigh the crucible and its melt.

Figure 3:
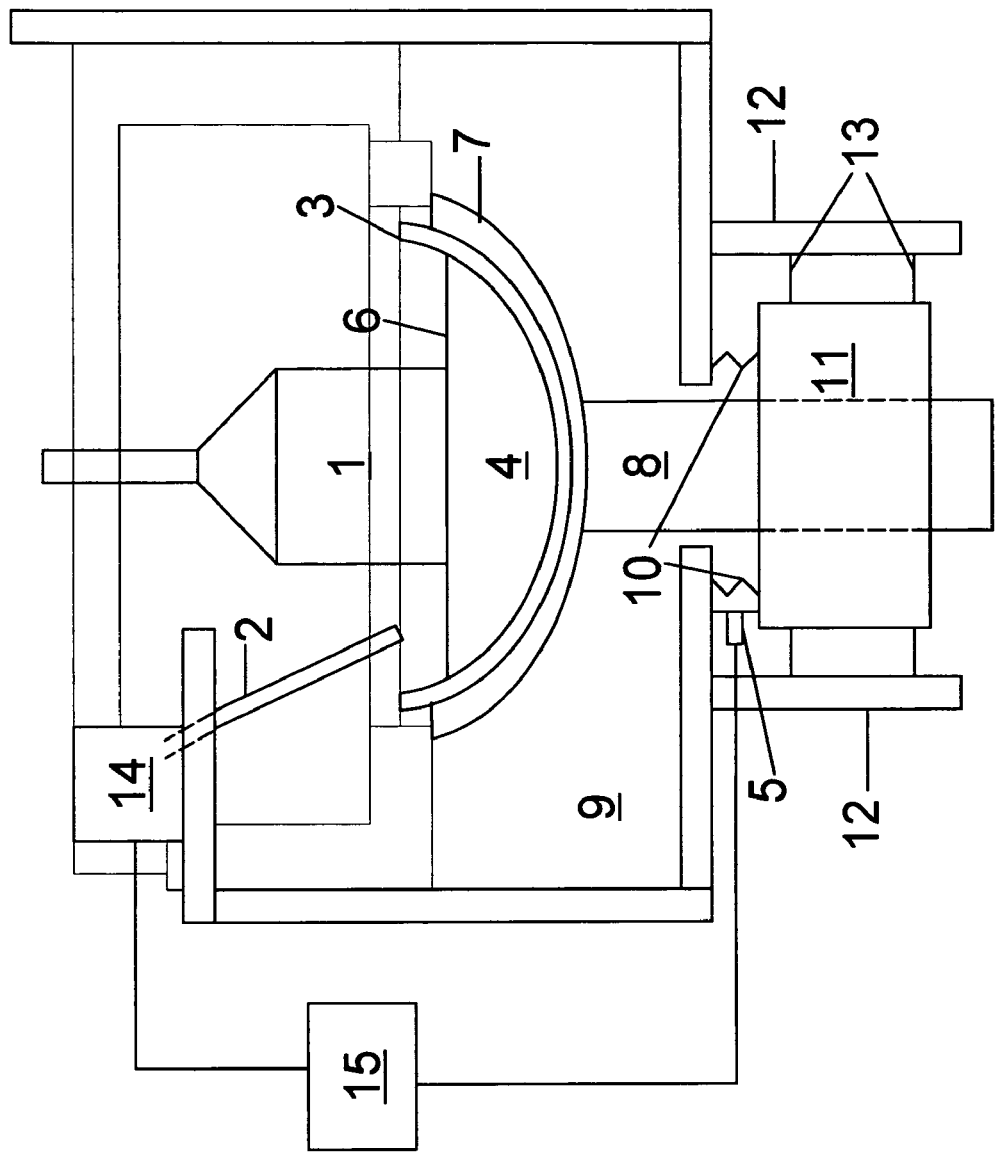
FIG. 3 is a schematic side view of a CZ system with a subsystem for introducing feedstock and with one embodiment of a crucible weighing system according to an aspect of the invention.

FIG. 3 shows a side view of a CZ growing system in accordance with an aspect of the invention that incorporates a feed tube 2 connected to a feeder 14. The feeder or means for introducing feedstock material into the melt moves the feedstock into the top of the tube such that feedstock then is transported down the tube into the melt. In this embodiment, the CZ crucible weighing system comprises flexible vacuum bellows 10, vacuum bearing 11, flexure mounts 12, flexures 13, and distance sensor 5. The flexible bellows 10 allow the vacuum bearing and crucible shaft to move vertically and horizontally while maintaining a vacuum seal to the vacuum bearing 11. The flexure mounts 12 are strong and stiff vertical members rigidly mounted to the vacuum chamber 9. The flexures 13 are elements attached between the vacuum bearing 11 and the flexure mounts 12 which provide great stiffness in the horizontal directions, but low to moderate stiffness in the vertical direction. The distance sensor 5 measures the changes in the vertical distance between the vacuum bearing and the vacuum chamber. As the melt is withdrawn and the melt level falls, the distance between the vacuum bearing and vacuum chamber decreases due to the combined spring effects of the bellows and flexures. In this way distance is directly correlated to the weight of the melt and the distance sensor 5 effectively measures the melt weight and therefore its level. The distance sensor 5 is connected to an electronic controller 15. The electronic controller 15 is also connected to the feeder 14. The system therefore can sense the weight of the melt and use that information to control the feeder to introduce just the right amount of feedstock so as to maintain the melt level constant as the crystal is grown. Measurements by the sensor can be conducted continuously or at selected intervals during an ingot growth cycle to provide conditions for desired ingot growth to the feedstock controller. The system alternatively can be used to recharge the system back to the original feedstock weight after a crystal has been withdrawn.

The flexures 13 and flexure mounts 12 for the crucible weighing system strongly resist horizontal motion of the crucible shaft. This is important because substantial torques can be generated in the horizontal plane by the rotation of the crucible, especially if it is not perfectly balanced. These torques will tend to make the shaft tilt and such tilting can interfere with the weight measurement. The vacuum chamber also may deform slightly as the temperature and pressure of the CZ system are changed. Such deformations also can produce horizontal relative motion between the shaft and the chamber and cause inaccurate weight measurements. The embodiment according to an aspect of the invention described herein is resistant to horizontal torques and deformations, and measures substantially vertical displacements that are directly and accurately correlated to crucible weight changes.

Figure 4:
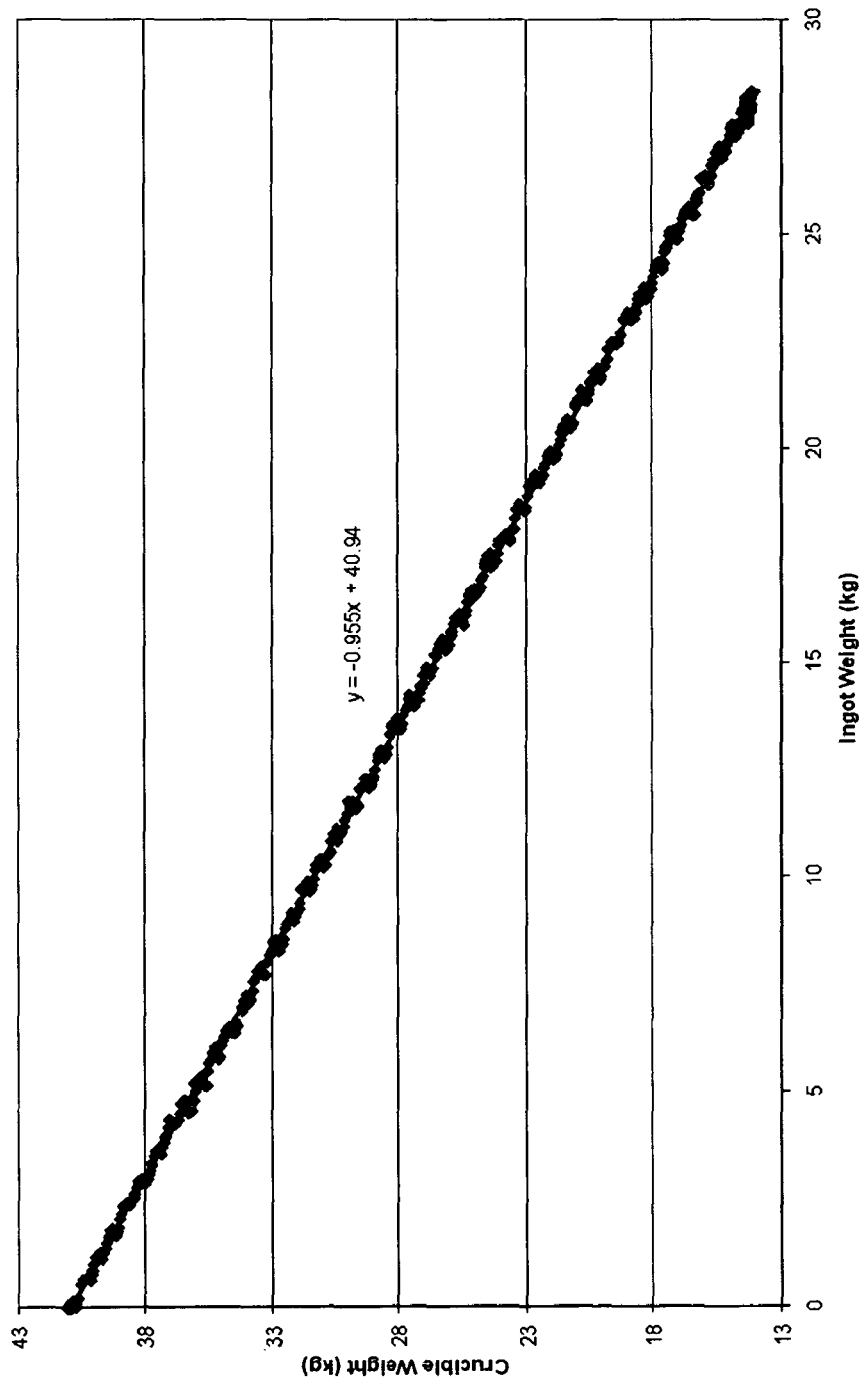
FIG. 4 is a data plot showing the weight of a silicon melt increasing while raw feed stock is being added to the crucible according to an aspect of the invention.

FIG. 4 is a data plot showing the weight of a crucible containing a silicon melt increasing, while raw feed stock is being added to the crucible during a dynamic recharging process. The crucible weight is plotted as a function of distance between the top of the silicon melt and a fixed reference point within the hot zone. As the mass of silicon in the crucible increases, the distance between the top of the melt and the fixed reference point decreases. This data was collected prior to introducing a silicon seed crystal. Therefore, the height measurement was not obstructed by the growing ingot thus allowing a direct correlation between melt height and crucible weight. The data points in FIG. 4 illustrate the ability to measure weight and thereby control the mass of silicon melt in the growing environment, allowing precise control of the volume/mass of initial silicon melt at the beginning of the process and/or the volume/mass while adding feedstock during growth. Using weight to determine the mass of silicon melt in the crucible eliminates the need for a visual reference and the need for a reflective melt surface.

Figure 5:
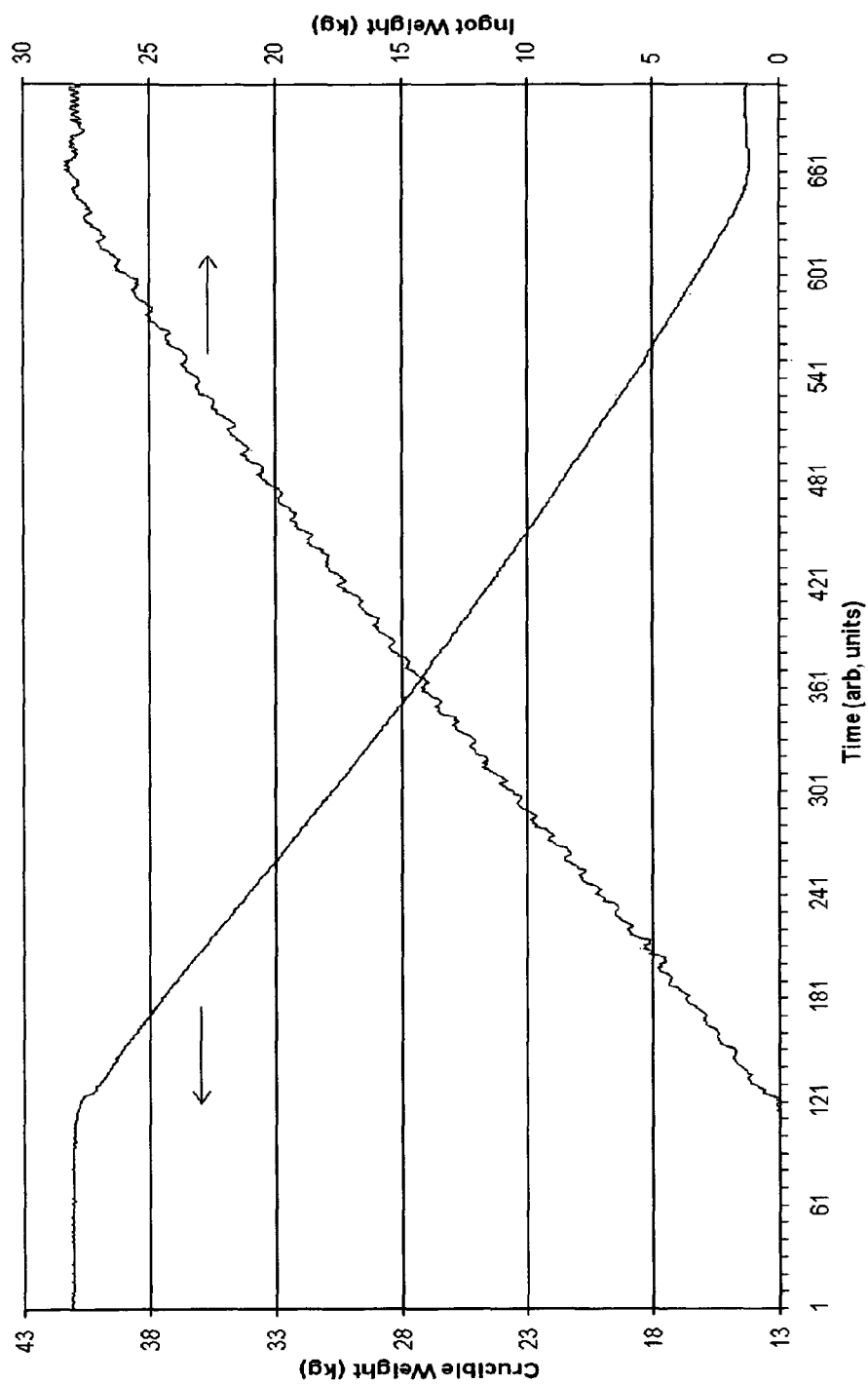
FIG. 5 is a data plot showing the weight of a silicon melt decreasing and the weight of an ingot increasing as silicon is consumed from the melt by a growing ingot according to an aspect of the invention.

FIG. 5 is a data plot showing the weight of a silicon melt decreasing and the weight of an ingot increasing as a function of time as silicon is consumed from the melt by a growing ingot. Notice that the crucible weight decreases as the ingot weight increases which is indicative of growing a crystal. When an ingot is growing, the visual reference for melt height is obstructed and it is difficult to determine the mass of silicon in the melt. According to an aspect of the invention, this plot demonstrates that the mass of silicon in the melt can be measured in a dynamic environment and that this measurement is far less noisy than the weight implied with respect to the growing ingot. Using a feedback loop in accordance with techniques that are well known, one can balance the introduction of new silicon to the melt to match accurately the amount of silicon being extracted by the growing ingot.

While the invention has been described in connection with what are presently considered to be the most practical and preferred embodiments, it is to be understood that the invention is not limited to the disclosed embodiments and alternatives as set forth above, but on the contrary is intended to cover various modifications and equivalent arrangements included within the scope of the forthcoming claims. For example, other materials that are amenable to being grown by the CZ process may be employed as the melt material, such as gallium arsenide, gallium phosphide, sapphire, and various metals, oxides and nitrides.

Also, other arrangements of flexures and flexure mounts can be designed to accomplish the purpose of sensing the weight of the crucible. The distance sensor can be any one of several commercially available types including LVDT (linear variable displacement transducer), capacitive, reflective optical, eddy current, or optical encoder based. Therefore, persons of ordinary skill in this field are to understand that all such equivalent arrangements and modifications are to be included within the scope of the following claims.

We claim:

1. A weighing system for maintaining optimal CZ crystal growth comprising:

a crucible provided in a vacuum chamber for holding a quantity of molten material from which a crystal is grown;

a feedstock introduction means for replenishing the material in the crucible;

a vacuum bearing provided with a central bore for supporting a shaft therein for rotatably moving the crucible, while maintaining a controlled atmosphere in the vacuum chamber;

flexure mounts depending from a base of the vacuum chamber for supporting the vacuum bearing;

flexible bellows provided between an upper surface of the vacuum bearing and the base of the vacuum chamber for enabling the vacuum bearing and crucible shaft to move while maintaining a vacuum seal to the vacuum bearing;

flexures for holding the vacuum bearing to the flexure mounts, the flexures having a stiffness in a horizontal direction that is greater than a stiffness in a vertical direction;

a sensor responsive to changes in the vertical distance between the vacuum bearing and the base of the vacuum chamber, such that as melt level falls, the distance between the vacuum bearing and vacuum chamber changes due to a spring effect of the bellows and flexures, and for producing an output signal representative of the vertical distance;

a feedstock controller responsive to the sensor output signal and coupled with the feedstock introduction means, for correlating the output signal with the melt level in the crucible, and for introducing an amount of feedstock so as to maintain the melt level constant as the crystal is grown.

2. A crucible weighing system according to claim 1, wherein the sensor measures the weight of the melt contained in the crucible continuously during an ingot growth cycle to provide conditions for desired ingot growth to the feedstock controller.

3. A weighing system for maintaining optimal CZ crystal growth comprising:
- a crucible supported in a vacuum chamber for holding a quantity of molten material at a desired melt level from which a crystal is grown;
- a feedstock introduction means for providing feedstock to the crucible;
- a vacuum bearing for supporting a shaft in a central bore therein for rotatably moving the crucible, while maintaining a controlled atmosphere in the process chamber;
- a flexible mount depending from a base of the vacuum chamber for supporting the vacuum bearing, the mount characterized by having a stiffness in a horizontal direction that is greater than a stiffness in a vertical direction, the mount allowing vertical displacement of the vacuum bearing with respect to the vacuum chamber as a function of the weight of the melt in the crucible;
- a sensor responsive to changes in the vertical displacement between the vacuum bearing and the vacuum chamber, and for producing an output signal representative thereof;
- a feedstock controller responsive to the sensor output signal for correlating vertical displacement with melt level, and coupled with the feedstock introduction means, for controllably introducing an amount of feedstock so as to maintain the melt level constant as the crystal is grown.

4. A crucible weighing system according to claim 3, wherein the feedstock controller stores a record of measurements corresponding to the weight of the melt contained in the crucible at selected intervals in an ingot growth cycle to control introduction of feedstock for desired ingot growth.

* * * * *